United States Patent
Shimada et al.

(10) Patent No.: US 10,482,941 B2
(45) Date of Patent: Nov. 19, 2019

(54) MAGNETIC MEMORY DEVICE

(71) Applicant: Toshiba Memory Corporation, Tokyo (JP)

(72) Inventors: Takuya Shimada, Tokyo (JP); Yasuaki Ootera, Kanagawa (JP); Tsuyoshi Kondo, Kanagawa (JP); Nobuyuki Umetsu, Kanagawa (JP); Michael Arnaud Quinsat, Kanagawa (JP); Masaki Kado, Kanagawa (JP); Susumu Hashimoto, Tokyo (JP); Shiho Nakamura, Kanagawa (JP); Hideaki Aochi, Mie (JP); Tomoya Sanuki, Mie (JP); Shinji Miyano, Kanagawa (JP); Yoshihiro Ueda, Kanagawa (JP); Yuichi Ito, Mie (JP); Yasuhito Yoshimizu, Mie (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 16/128,554

(22) Filed: Sep. 12, 2018

(65) Prior Publication Data
US 2019/0287598 A1    Sep. 19, 2019

(30) Foreign Application Priority Data
Mar. 14, 2018  (JP) .................................. 2018-047148

(51) Int. Cl.
*G11C 11/16*    (2006.01)
*H01L 27/22*    (2006.01)
(Continued)

(52) U.S. Cl.
CPC ........ *G11C 11/1675* (2013.01); *G11C 11/161* (2013.01); *G11C 11/1673* (2013.01);
(Continued)

(58) Field of Classification Search
None
See application file for complete search history.

(56) References Cited

U.S. PATENT DOCUMENTS 9,293,696 B2   3/2016   Ootera et al.
9,396,811 B2   7/2016   Ootera et al.
(Continued)

FOREIGN PATENT DOCUMENTS

JP   2015-173145 A   10/2015
JP   2016-9806 A    1/2016
JP   2017-54936 A   3/2017

*Primary Examiner* — Tan T. Nguyen
(74) *Attorney, Agent, or Firm* — Finnegan, Henderson, Farabow, Garrett & Dunner, L.L.P.

(57) ABSTRACT

According to one embodiment, a magnetic memory device includes a first memory portion, a first conductive portion, a first interconnection, and a controller. The first memory portion includes a first magnetic portion including a first portion and a second portion, a first magnetic layer, and a first nonmagnetic layer provided between the second portion and the first magnetic layer. The first conductive portion is electrically connected to the first portion. The first interconnection is electrically connected to the first magnetic layer. The controller is electrically connected to the first conductive portion and the first interconnection. The controller applies a first pulse having a first pulse height and a first pulse length between the first conductive portion and the first interconnection in a first write operation and applies a second pulse having a second pulse height and a second pulse length in a first shift operation.

17 Claims, 5 Drawing Sheets

(51) Int. Cl.
*H01F 10/32* (2006.01)
*H01L 43/02* (2006.01)
*G11C 11/02* (2006.01)

(52) U.S. Cl.
CPC ....... *H01F 10/3254* (2013.01); *H01L 27/228* (2013.01); *H01L 43/02* (2013.01); *G11C 11/02* (2013.01); *G11C 11/16* (2013.01)

(56) References Cited

U.S. PATENT DOCUMENTS

| | | |
|---|---|---|
| 9,705,073 B2 | 7/2017 | Morise et al. |
| 2017/0229640 A1 | 8/2017 | Kado et al. |
| 2019/0088345 A1* | 3/2019 | Quinsat .............. G11C 19/0841 |
| 2019/0088346 A1* | 3/2019 | Ootera ................ G11C 19/0841 |

* cited by examiner

MAGNETIC MEMORY DEVICE

CROSS-REFERENCE TO RELATED APPLICATIONS

This application is based upon and claims the benefit of priority from Japanese Patent Application No. 2018-047148, filed on Mar. 14, 2018; the entire contents of which are incorporated herein by reference.

FIELD

Embodiments described herein relate generally to a magnetic memory device.

BACKGROUND

There is a magnetic memory device that uses a magnetic member. It is desirable to increase the storage density of the magnetic memory device.

DETAILED DESCRIPTION

According to one embodiment, a magnetic memory device includes a first memory portion, a first conductive portion, a first interconnection, and a controller. The first memory portion includes a first magnetic portion including a first portion and a second portion, a first magnetic layer, and a first nonmagnetic layer provided between the second portion and the first magnetic layer. The first conductive portion is electrically connected to the first portion. The first interconnection is electrically connected to the first magnetic layer. The controller is electrically connected to the first conductive portion and the first interconnection. The controller is configured to apply a first pulse between the first conductive portion and the first interconnection in a first write operation. The first pulse has a first pulse height and a first pulse length. The controller is configured to apply a second pulse between the first conductive portion and the first interconnection in a first shift operation. The second pulse has a second pulse height and a second pulse length. An absolute value of the second pulse height is less than an absolute value of the first pulse height. The second pulse length is longer than the first pulse length.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

Figures 1A, 2A:
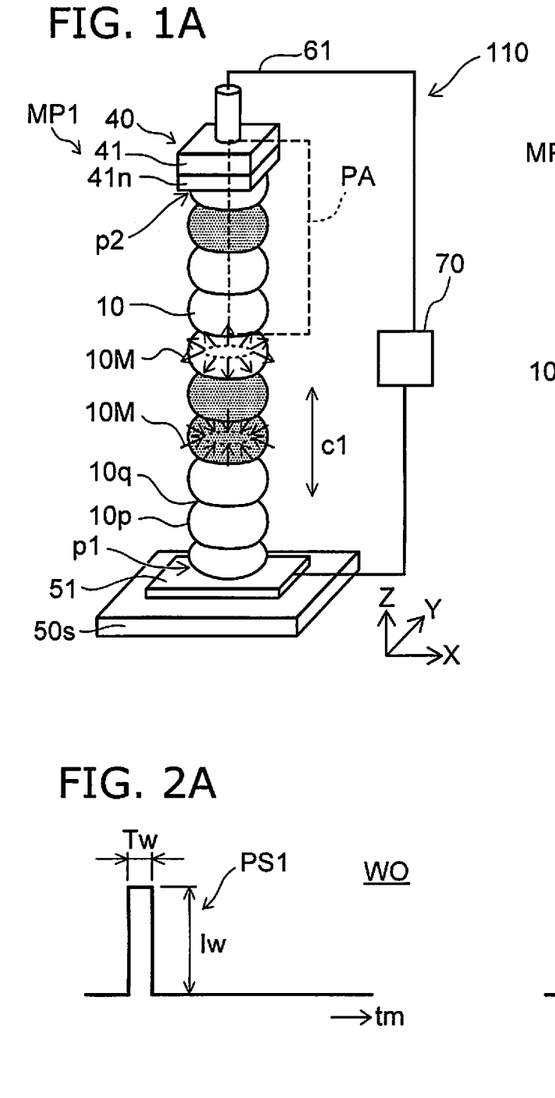
FIG. 1A and FIG. 1B are schematic views illustrating a magnetic memory device according to a first embodiment.
FIG. 2A to FIG. 2D are schematic views illustrating an operation of the magnetic memory device according to the first embodiment.
Figures 1B, 2B, 2D:
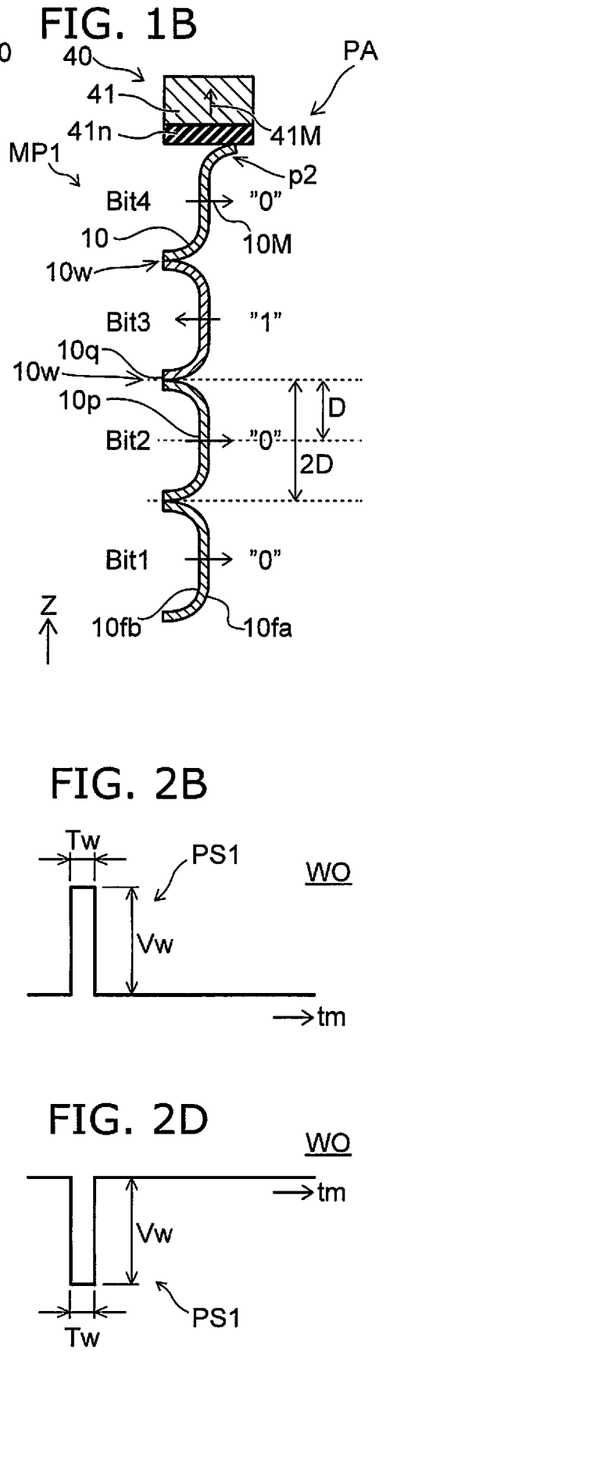

FIG. 1A and FIG. 1B are schematic views illustrating a magnetic memory device according to a first embodiment.

FIG. 1A is a perspective view. FIG. 1B is a cross-sectional view illustrating portion PA of FIG. 1A.

As shown in FIG. 1A, the magnetic memory device 110 according to the embodiment includes a first memory portion MP1, a first conductive portion 51, a first interconnection 61, and a controller 70.

The first memory portion MP1 includes a first magnetic portion 10, a first magnetic layer 41, and a first nonmagnetic layer 41n.

In one example, for example, the first magnetic portion 10 has a tubular configuration extending along a first direction. The first magnetic portion 10 includes a first portion p1 and a second portion p2. For example, the direction from the first portion p1 toward the second portion p2 corresponds to the first direction. In one example, the first portion p1 is one end portion; and the second portion p2 is another end portion. In the embodiment, the configuration of the first magnetic portion 10 is arbitrary.

The first direction is taken as a Z-axis direction. One direction perpendicular to the Z-axis direction is taken as an X-axis direction. A direction perpendicular to the Z-axis direction and the X-axis direction is taken as the Y-axis direction.

The first nonmagnetic layer 41n is provided between the second portion p2 and the first magnetic layer 41. For example, the first magnetic layer 41, the first nonmagnetic layer 41n, and the second portion p2 are included in a first element 40. For example, the first element 40 corresponds to a magnetoresistance effect element (e.g., a MTJ (Magnetic Tunnel Junction) element).

The first conductive portion 51 is electrically connected to the first portion p1. The first interconnection 61 is electrically connected to the first magnetic layer 41. The controller 70 is electrically connected to the first conductive portion 51 and the first interconnection 61.

For example, a base body 50s is provided. The first conductive portion 51 is provided on the base body 50s. The first magnetic portion 10 is provided on the first conductive portion 51. For example, the first element 40 is provided on at least a portion of the first magnetic portion 10.

In the example as shown in FIG. 1A, the first magnetic portion 10 has "pinched-in portions". For example, the first magnetic portion 10 includes a protrusion 10p and a recess 10q. The width of the protrusion 10p is wider than the width of the recess 10q. The multiple protrusions 10p and the multiple recesses 10q are arranged alternately along the Z-axis direction. The width corresponds to the length (the distance) in a direction aligned with the X-Y plane.

As described above, the first magnetic portion 10 has a tubular configuration extending along the first direction (the Z-axis direction). As shown in FIG. 1B, the first magnetic portion 10 has a first surface 10*fa* on the outer side of the tube. A second direction is taken as a direction crossing the first direction. The second direction is, for example, a radial direction of the tube (a direction from the inner side toward the outer side). The position of the first surface 10*fa* in the second direction changes periodically along the first direction (the Z-axis direction).

For example, the first magnetic portion 10 has a second surface 10*fb* on the inner side of the tube. The position of the second surface 10*fb* in the second direction may change periodically along the first direction.

For example, the first magnetic portion 10 stores information. For example, the orientation of a first magnetization 10M of the first magnetic portion 10 is the inward orientation or the outward orientation of the tube. The orientation of the first magnetization 10M corresponds to the stored information.

As shown in FIG. 1B, the distance between two recesses 10*q* is taken as a period 2D. The distance between the protrusion 10*p* and the recess 10*q* corresponds to ½ of the period 2D. The region of the period 2D corresponds to the memory bit. For example, bits "Bit 1" to "Bit 4," etc., are provided. The magnetizations (the first magnetizations 10M) of these bits correspond to the information of "0" or "1."

For example, a magnetization 41M of the first magnetic layer 41 is substantially fixed. The orientation of the magnetization of the second portion p2 is reversed by causing a current (a write current) to flow in a region including the first magnetic layer 41, the first nonmagnetic layer 41*n*, and the second portion p2. For example, the orientation of the magnetization corresponds to the orientation of the current.

On the other hand, as shown in FIG. 1B, the first magnetic portion 10 includes a domain wall 10*w*. The domain wall 10*w* is formed between two regions where the orientations of the first magnetizations 10M are different. The domain walls 10*w* are shifted by causing a current (a shift current) to flow in the first magnetic portion 10. For example, the orientation of the shift changes (reverses) according to the orientation of the current. For example, the orientation of the magnetization of the second portion p2 (the written information) is shifted through the first magnetic portion 10.

The electrical resistance between the first magnetic layer 41 and the first magnetic portion 10 changes based on the relationship between the orientation of the magnetization of the second portion p2 and the magnetization 41M of the first magnetic layer 41. The magnetization (the information) of the second portion p2 is read by measuring the electrical resistance (or a current, a voltage, or the like that is a value corresponding to the electrical resistance). The magnetization of the desired position of the first magnetic portion 10 is moved to the second portion p2 by the shift operation. Thereby, the information of the desired position is read.

Thus, the write operation, the shift operation, and the read operation are performed in the magnetic memory device 110. For example, these operations are performed by the controller 70.

In the embodiment, these operations are performed by applying various pulses between the first conductive portion 51 and the first interconnection 61. The current that accompanies the pulse flows in a first current path c1 including the first conductive portion 51 and the first interconnection 61. The orientation of the current includes the case of the orientation from the first conductive portion 51 toward the first interconnection 61 and the case of the orientation from the first interconnection 61 toward the first conductive portion 51.

An example of these operations of the magnetic memory device 110 will now be described.

FIG. 2A to FIG. 2D are schematic views illustrating an operation of the magnetic memory device according to the first embodiment.

Figure 2C:
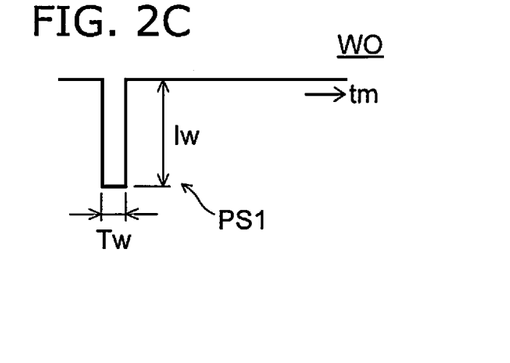

These drawings illustrate a write operation WO (a first write operation). The horizontal axis of these drawings is a time tm. In FIG. 2A and FIG. 2C, the vertical axis is the current. In FIG. 2B and FIG. 2D, the vertical axis is the voltage. FIG. 2A and FIG. 2B correspond to the operation of writing first information. FIG. 2C and FIG. 2D correspond to the operation of writing second information. The first information is one of "0" or "1." The second information is the other of "0" or "1." These drawings illustrate the pulses supplied between the first conductive portion 51 and the first interconnection 61 in the write operation WO. The difference between the information corresponds to the polarity of the write pulse.

In the write operation WO, the controller 70 applies a first pulse PS1 between the first conductive portion 51 and the first interconnection 61. The first pulse PS1 has a first pulse height and a first pulse length Tw. For example, the first pulse height may be a pulse height Iw of the current or a pulse height Vw of the voltage.

FIG. 3A to FIG. 3D are schematic views illustrating an operation of the magnetic memory device according to the first embodiment.

Figures 3A, 3C:
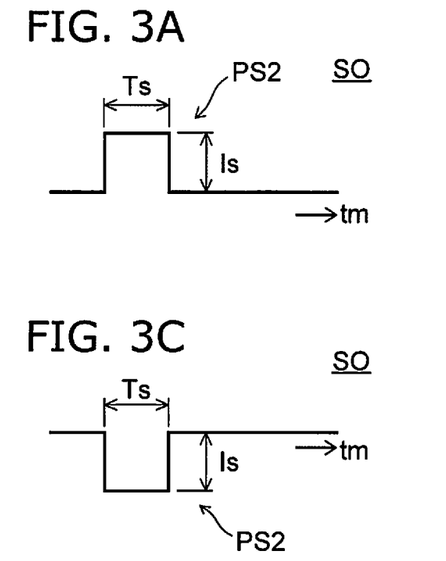
FIG. 3A to FIG. 3D are schematic views illustrating an operation of the magnetic memory device according to the first embodiment.
Figures 3B, 3D:
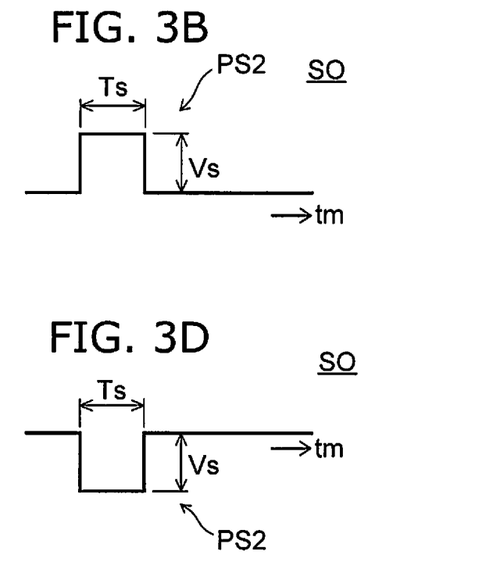

These drawings illustrate a shift operation SO (a first shift operation). The horizontal axis of these drawings is the time tm. In FIG. 3A and FIG. 3C, the vertical axis is the current. In FIG. 3B and FIG. 3D, the vertical axis is the voltage. FIG. 3A and FIG. 3B correspond to the operation of shifting the information in a first orientation. FIG. 3C and FIG. 3D correspond to the operation of shifting the information in a second orientation. For example, the first orientation is one of the orientation from the first portion toward the second portion or the orientation from the second portion toward the first portion. The second orientation is, for example, the other of the orientation from the first portion toward the second portion or the orientation from the second portion toward the first portion. These drawings illustrate the pulse supplied between the first conductive portion 51 and the first interconnection 61 in the shift operation SO. The orientation recited above corresponds to the polarity of the shift pulse.

In the shift operation SO, the controller 70 applies a second pulse PS2 between the first conductive portion 51 and the first interconnection 61. The second pulse PS2 has a second pulse height and a second pulse length Ts. The second pulse height may be, for example, a pulse height Is of the current or a pulse height Vs of the voltage.

As shown in FIG. 2A to FIG. 2D and FIG. 3A to FIG. 3D, the absolute value of the second pulse height is less than the absolute value of the first pulse height. For example, the absolute value of the pulse height Is of the current is less than the absolute value of the pulse height Iw of the current. For example, the absolute value of the pulse height Vs of the voltage is less than the absolute value of the pulse height Vw of the voltage.

The second pulse length Ts is longer than the first pulse length Tw.

By using such a first pulse PS1 and such a second pulse PS2, the erroneous shifting of the information of the first magnetic portion 10 in the write operation WO can be suppressed. For example, the erroneous writing of information to the first magnetic portion 10 in the shift operation SO is suppressed.

As illustrated in FIG. 1A, for example, the first magnetic layer 41 opposes a portion (the second portion p2) of the first magnetic portion 10. In the write operation WO, the magnetization of the second portion p2 is reversed. In the write operation WO, the magnetization of the second portion p2 can be reversed by applying a high first pulse PS1. Because the first pulse PS1 is short, the movement distance of the domain wall 10w is smaller than the period 2D even if the domain wall 10w of the first magnetic portion 10 moves. Therefore, by relaxation, the position of the domain wall 10w returns to the original position. Thereby, in the case where the first pulse PS1 is applied, the domain wall 10w substantially does not move. Shifting substantially does not occur. The erroneous shifting is suppressed.

On the other hand, in the shift operation SO, the domain wall 10w is moved past the period 2D due to the long second pulse PS2. In other words, the shift operation is performed. Because the second pulse PS2 is low, the magnetization of the second portion p2 substantially is not reversed. Accordingly, erroneous writing is suppressed.

In the magnetic memory device 110 according to the embodiment, a stable operation is obtained without using a complex switch circuit. The complex switch circuit can be omitted. According to the embodiment, a magnetic memory device is possible in which the storage density can be increased.

FIG. 4A to FIG. 4D are schematic views illustrating an operation of the magnetic memory device according to the first embodiment.

Figure 4A:
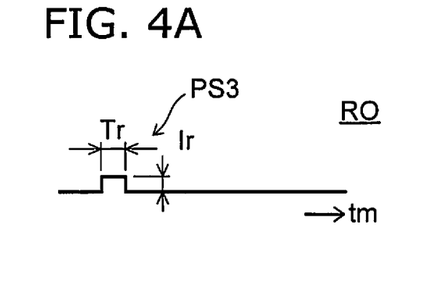
FIG. 4A to FIG. 4D are schematic views illustrating an operation of the magnetic memory device according to the first embodiment.
Figure 4B:
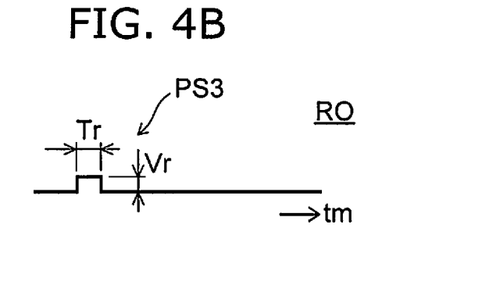
Figure 4C:
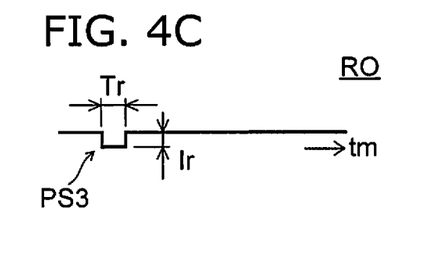
Figure 4D:
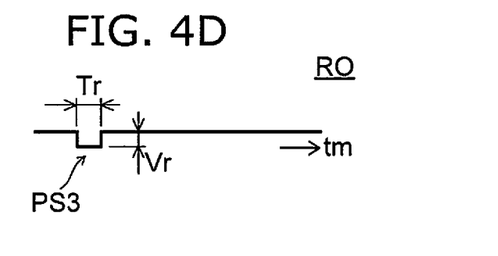

These drawings illustrate a read operation RO (a first read operation). In these drawings, the horizontal axis is the time tm. In FIG. 4A and FIG. 4C, the vertical axis is the current. In FIG. 4B and FIG. 4D, the vertical axis is the voltage. These drawings illustrate the pulse supplied between the first conductive portion 51 and the first interconnection 61 in the read operation RO.

As shown in these drawings, the controller 70 applies a third pulse PS3 between the first conductive portion 51 and the first interconnection 61 in the read operation RO. The third pulse PS3 has a third pulse height and a third pulse length Tr. For example, the third pulse height may be a pulse height Ir of the current or a pulse height Vr of the voltage.

As shown in FIG. 4A to FIG. 4D, the polarity of the third pulse PS3 may be positive or may be negative.

As shown in FIG. 3A to FIG. 3D and FIG. 4A to FIG. 4D, the absolute value of the third pulse height is less than the absolute value of the second pulse height. Thereby, the shifting of the information in the read operation RO can be suppressed.

FIG. 5A to FIG. 5F are schematic views illustrating an operation of the magnetic memory device according to the first embodiment.

Figures 5A, 5B:
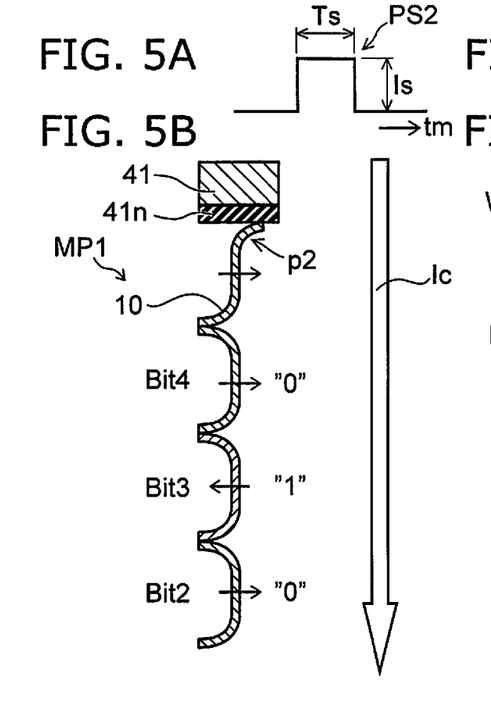
FIG. 5A to FIG. 5F are schematic views illustrating an operation of the magnetic memory device according to the first embodiment.
Figure 5C:
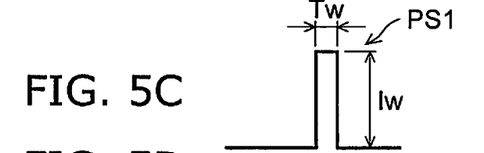
Figure 5D:
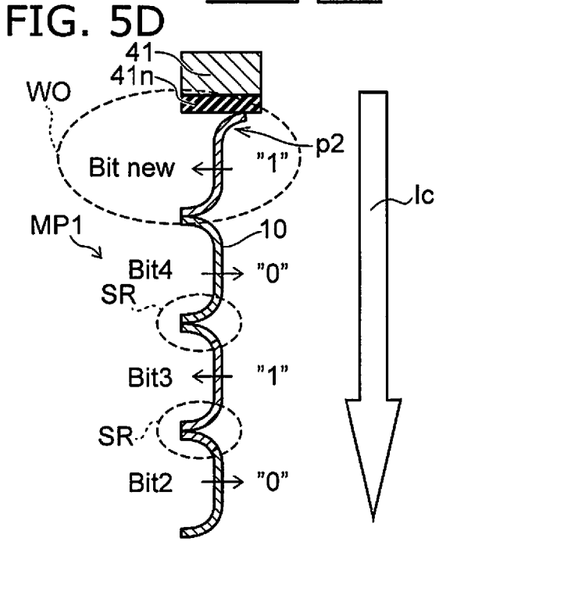
Figure 5E:
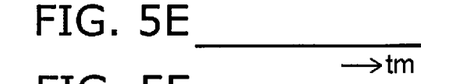
Figure 5F:
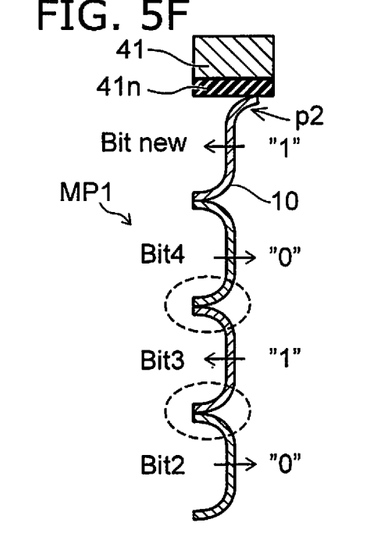
Figure 6A:
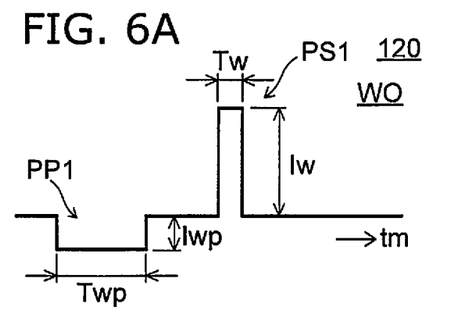
FIG. 6A to FIG. 6D are schematic views illustrating an operation of a magnetic memory device according to a second embodiment.
Figure 6B:
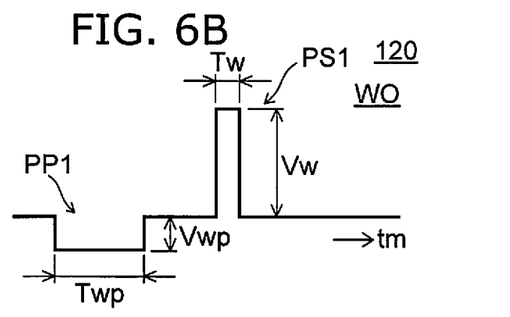
Figure 6C:
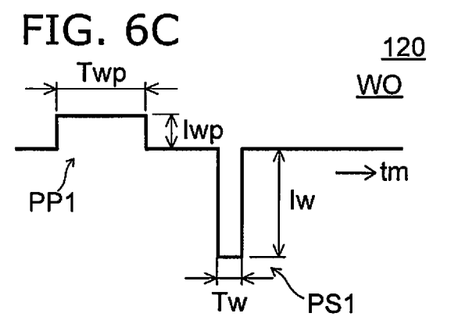
Figure 6D:
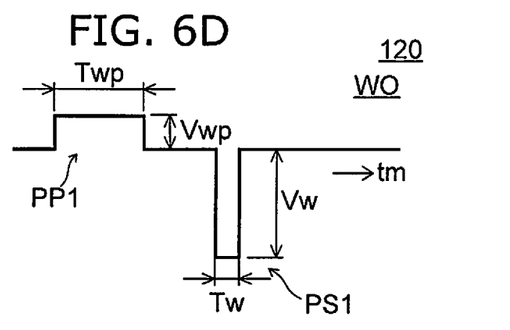

FIG. 5A, FIG. 5C, and FIG. 5E illustrate the pulses applied between the first conductive portion 51 and the first interconnection 61. FIG. 5B, FIG. 5D, and FIG. 5F illustrate the magnetizations of the first magnetic portion 10. A current Ic flows in the first magnetic portion 10 due to the application of the pulse. The initial state is taken to be the state of FIG. 1B.

For example, a shift pulse (the second pulse PS2) is applied as shown in FIG. 5A. The height of the shift pulse (e.g., the pulse height Is of the current) is larger than the current for the shifting of the domain wall 10w. The pulse height Is of the current is smaller than the current for recording (writing) of the magnetic domain. Even when the bits of the first magnetic portion 10 are shifted, the magnetic domains are not reversed. As shown in FIG. 5B, for example, one bit is shifted by the shift pulse.

For example, the shift of one bit occurs when the distance that the domain wall 10w shifts within the time of the shift pulse (a pulse length Ts) is not less than the period 2D of the "pinched-in portion" of the first magnetic portion 10. For example, the movement velocity of the domain wall 10w of the shift pulse (e.g., the pulse height Is of the current) is taken as vs. The shift of at least one bit occurs when vs×Ts>D.

The write pulse (the first pulse PS1) is applied as shown in FIG. 5C. The height of the write pulse (e.g., the pulse height Iw of the current) is larger than the current for recording (writing) of the magnetic domain. The pulse height Iw of the current is larger than the current for the shifting of the domain wall 10w. The write pulse is set to be longer than the time for the reversal of the magnetic domain. Thereby, as shown in FIG. 5D, the desired information is written to the first magnetic portion 10 (the region including the second portion p2). Thus, the write operation WO is performed.

In the write operation WO, there are cases where an unintended bit shift SR occurs. In the embodiment, the write pulse is set so that the shift distance of the domain wall 10w is shorter than ½ of the period 2D. Thereby, the movement of the domain wall 10w past the pinched-in portion is suppressed.

As shown in FIG. 5E, the pulse is not applied in the relaxation state after the write pulse (the first pulse PS1). As shown in FIG. 5F, the domain wall 10w returns to the original position due to the "pinched-in configuration" in the relaxation state. The erroneous shift of the information is suppressed. For example, the velocity of the domain wall 10w for the pulse height Iw of the current is taken as vw. For example, the erroneous shift is suppressed when vw×Tw<D.

In one example of the embodiment, the absolute value of the second pulse height (e.g., the pulse height Is of the current) is ½ of the absolute value of the first pulse height (e.g., the pulse height Iw of the current) or less. For example, the absolute value of the pulse height Vs of the voltage is ½ of the absolute value of the pulse height Vw of the voltage or less. The second pulse length Ts is 2 times the first pulse length Tw or more.

For example, in the write operation WO, the first pulse PS1 is positive when writing the first information (referring to FIG. 2A). In the write operation WO, the first pulse PS1 is negative when writing the second information that is different from the first information (referring to FIG. 2C).

In the embodiment, the second pulse is positive when shifting the information in the first orientation in the shift operation SO (referring to FIG. 3A). In the shift operation SO, the second pulse PS2 is negative when shifting the information in the second orientation that is the reverse of the first orientation (referring to FIG. 3C).

As described above, the first magnetic portion 10 includes the domain wall 10w. The positions of the domain wall 10w are different before and after the application of the second pulse PS2 (referring to FIG. 1B and FIG. 5B).

Second Embodiment

FIG. 6A to FIG. 6D are schematic views illustrating an operation of a magnetic memory device according to a second embodiment.

These drawings illustrate an operation of the magnetic memory device 120 according to the embodiment. For example, the configuration of the magnetic memory device 120 is similar to the configuration of the magnetic memory device 110 described in reference to FIG. 1A and FIG. 1B. The write operation of the magnetic memory device 120 is different from the write operation WO of the magnetic memory device 110.

In the magnetic memory device 120 as shown in these drawings, the controller 70 applies a first prepulse PP1 between the first conductive portion 51 and the first interconnection 61 before the application of the first pulse PS1 in the write operation WO. The first prepulse PP1 has a first prepulse height and a first prepulse length Twp. The first prepulse height is, for example, a pulse height Iwp of the current or a pulse height Vwp of the voltage.

The absolute value of the first prepulse height is less than the absolute value of the first pulse height. For example, the absolute value of the pulse height Iwp of the current is less than the absolute value of the pulse height Iw of the current. For example, the absolute value of the pulse height Vwp of the current is less than the absolute value of the pulse height Vw of the current. The first prepulse length Twp is longer than the first pulse length Tw. The polarity of the first prepulse PP1 is the reverse of the polarity of the first pulse PS1.

In such a write operation WO, the domain wall 10w that tends to have unintended movement due to the first pulse PS1 is moved in the reverse direction beforehand by the first prepulse PP1. Subsequently, by applying the first pulse PS1, the domain wall 10w can be maintained at the intended position (the initial state position). The erroneous shift can be suppressed.

In the embodiment, the first prepulse length Twp is, for example, not less than 0.2 times but less than 1 times the second pulse length Ts (the length of the shift pulse). For example, the first prepulse length Twp may be 0.5 times the second pulse length Ts or less.

Third Embodiment

Figure 7:
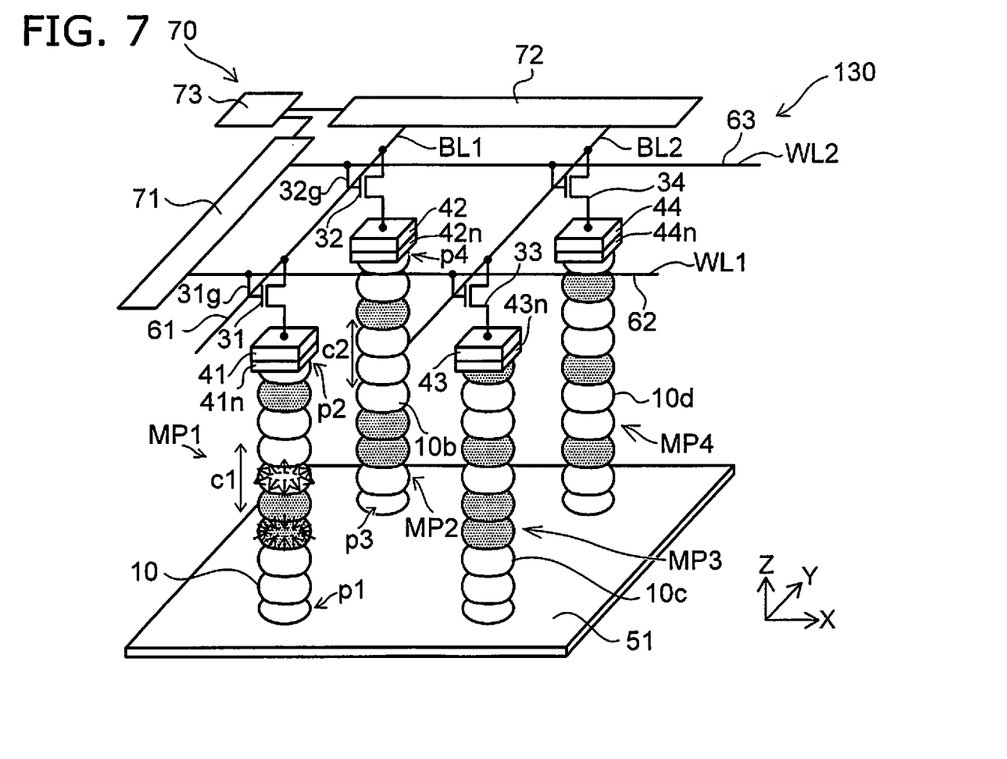
FIG. 7 is a schematic view illustrating a magnetic memory device according to a third embodiment.

FIG. 7 is a schematic view illustrating a magnetic memory device according to a third embodiment.

As shown in FIG. 7, multiple word lines (a first word line WL1, a second word line WL2, etc.), multiple bit lines (a first bit line BL1, a second bit line BL2, etc.), multiple memory portions (e.g., the first to fourth memory portions MP1 to MP4, etc.) are provided in the magnetic memory device 130 according to the embodiment.

The first word line WL1 and the second word line WL2 are connected to a first circuit 71 (e.g., a word line selector). The first bit line BL1 and the second bit line BL2 are connected to a second circuit 72 (e.g., a bit line selector). These circuits are connected to a control circuit 73. For example, the first circuit 71, the second circuit 72, and the control circuit 73 are included in the controller 70.

For example, the first interconnection 61 corresponds to the first bit line BL1. A second interconnection 62 and a third interconnection 63 are provided in the example. For example, the second interconnection 62 corresponds to the first word line WL1. The third interconnection 63 corresponds to the second word line WL2.

A first switch 31 is provided between the first memory portion MP1 and the first bit line BL1. A second switch 32 is provided between the second memory portion MP2 and the first bit line BL1. A third switch 33 is provided between the third memory portion MP3 and the second bit line BL2.

A fourth switch 34 is provided between the fourth memory portion MP4 and the second bit line BL2. These switches are, for example, transistors. These switches may be, for example, nonlinear elements.

The second memory portion MP2 includes, for example, a second magnetic portion 10b, a second magnetic layer 42, and a second nonmagnetic layer 42n. The second magnetic portion 10b includes a third portion p3 and a fourth portion p4. The second nonmagnetic layer 42n is provided between the fourth portion p4 and the second magnetic layer 42.

In the example, the first conductive portion 51 is electrically connected to the third portion p3. Another conductive portion may be provided; and the conductive portion may be electrically connected to the third portion p3.

Similarly, the third memory portion MP3 includes, for example, a third magnetic portion 10c, a third magnetic layer 43, and a third nonmagnetic layer 43n. The fourth memory portion MP4 includes, for example, a fourth magnetic portion 10d, a fourth magnetic layer 44, and a fourth nonmagnetic layer 44n.

The second switch 32 is provided in a second current path c2. The second current path c2 includes the second memory portion MP2 and the first interconnection 61. The second current path c2 may further include the first conductive portion 51.

As described above, the first switch 31 is provided in the first current path c1 between the first conductive portion 51 and the first interconnection 61. For example, the write pulse (the first pulse PS1) is supplied to the first memory portion MP1 via the first switch 31. The shift pulse (the second pulse PS2) also is supplied to the first memory portion MP1 via the first switch 31. The read pulse (the third pulse PS3) also is supplied to the first memory portion MP1 via the first switch 31.

Similarly, for example, in the second memory portion MP2 as well, the write pulse, the shift pulse, and the read pulse are supplied to the second memory portion MP2 via the second switch 32.

For these memory portions, the select and the unselect are controlled by the operations of the switches. For example, the second interconnection 62 (the first word line WL1) is electrically connected to a first gate 31g of the first switch 31. For example, the third interconnection 63 (the second word line WL2) is electrically connected to a second gate 32g of the second switch 32. These switches are controlled by the potentials of the second interconnection 62 and the third interconnection 63.

For example, in the first write operation recited above (the write operation WO of the first memory portion MP1), the controller 70 switches the first switch 31 ON and switches the second switch 32 OFF. In the first shift operation recited above (the shift operation SO of the first memory portion MP1), the controller 70 switches the first switch 31 ON and switches the second switch 32 OFF.

For example, in the second write operation (the write operation WO of the second memory portion MP2), the controller 70 switches the first switch 31 OFF and switches the second switch 32 ON. In the second shift operation (the shift operation SO of the second memory portion MP2), the controller 70 switches the first switch 31 OFF and switches the second switch 32 ON.

The electrical resistance in the ON state is lower than the electrical resistance in the OFF state.

Figure 8:
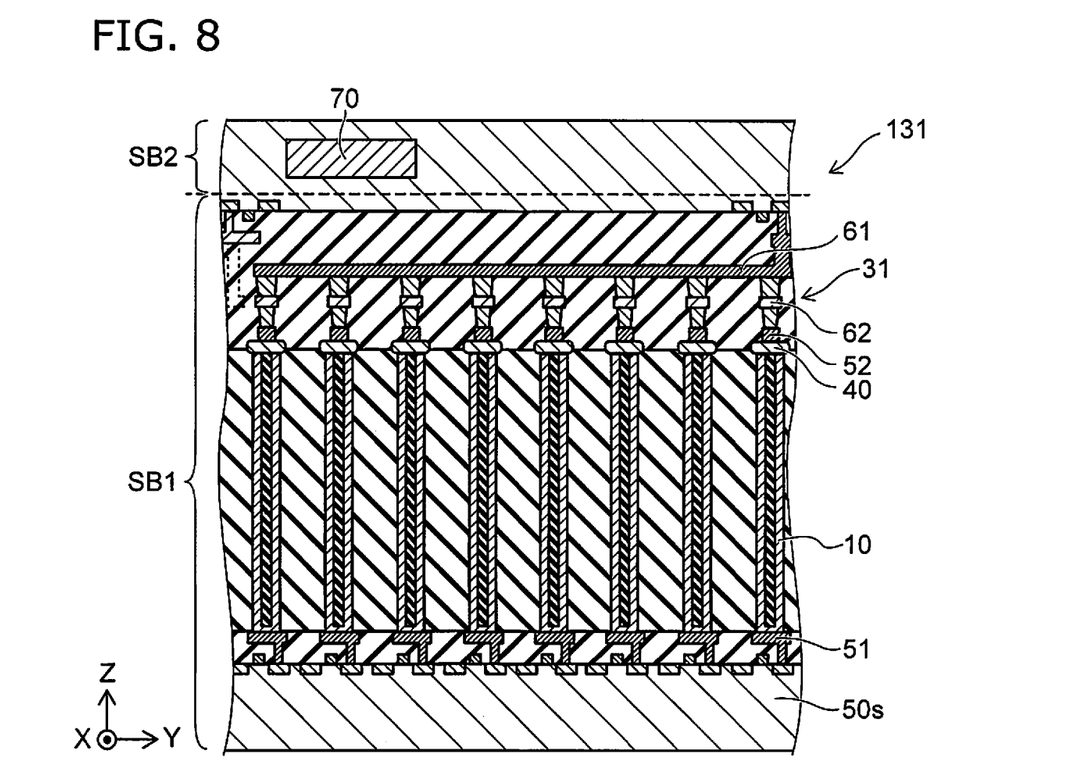
FIG. 8 is a schematic cross-sectional view illustrating the magnetic memory device according to the third embodiment.

FIG. 8 is a schematic cross-sectional view illustrating the magnetic memory device according to the third embodiment.

As shown in FIG. 8, a first structure body SB1 and a second structure body SB2 are provided in the magnetic memory device 131 according to the embodiment. The first structure body SB1 includes, for example, the base body 50s, the first conductive portion 51, the first magnetic portion 10, the first element 40, the first switch 31, the first interconnection 61, and the second interconnection 62. In the example, the first element 40 and the first switch 31 are electrically connected by a second conductive portion 52 (e.g., a via electrode).

The second structure body SB2 includes the controller 70. For example, the first structure body SB1 and the second structure body SB2 are formed separately; and the first structure body SB1 and the second structure body SB2 may be bonded. For example, heat treatment is performed at a high temperature to form the first structure body SB1. The high temperature is not applied to the second structure body SB2. Good characteristics are obtained for both the first structure body SB1 and the second structure body SB2.

In the embodiments recited above, the first magnetic portion 10 includes, for example, at least one selected from the group consisting of Ni, Co, and Fe. The first magnetic portion 10 may include at least one rare-earth element. For example, the first magnetic portion 10 may include at least one rare-earth element and at least one selected from the group consisting of Ni, Co, and Fe.

The first magnetic layer 41 includes, for example, at least one selected from the group consisting of Ni, Co, and Fe. The first magnetic layer 41 may include, for example, multiple magnetic films that are stacked. The first magnetic layer 41 may include multiple magnetic films having an antiferromagnetic coupling.

The first nonmagnetic layer 41n includes, for example, at least one selected from the group consisting of MgO, MgAlO, and AlO. The first nonmagnetic layer 41n may include a stacked film including multiple films including these materials. The first nonmagnetic layer 41n may further include other nonmagnetic metals.

At least a portion of each of the first conductive portion 51 and the second conductive portion 52 may include at least one selected from the group consisting of W, Cu, Al, Mo, Ti, and Au. At least one of the first conductive portion 51 or the second conductive portion 52 may include a magnetic body.

The embodiments may include the following configurations (e.g., technological proposals).

Configuration 1

A magnetic memory device, comprising:
a first memory portion including
a first magnetic portion including a first portion and a second portion,
a first magnetic layer, and
a first nonmagnetic layer provided between the second portion and the first magnetic layer;
a first conductive portion electrically connected to the first portion;
a first interconnection electrically connected to the first magnetic layer; and
a controller electrically connected to the first conductive portion and the first interconnection,
the controller applying a first pulse between the first conductive portion and the first interconnection in a first write operation, the first pulse having a first pulse height and a first pulse length,
the controller applying a second pulse between the first conductive portion and the first interconnection in a first shift operation, the second pulse having a second pulse height and a second pulse length,
an absolute value of the second pulse height being less than an absolute value of the first pulse height,
the second pulse length being longer than the first pulse length.

Configuration 2

The magnetic memory device according to Configuration 1, wherein
the controller applies a third pulse between the first conductive portion and the first interconnection in a first read operation, the third pulse having a third pulse height and a third pulse length, and
an absolute value of the third pulse height is less than the absolute value of the second pulse height.

Configuration 3

The magnetic memory device according to Configuration 2, further comprising a first switch provided in a first current path between the first conductive portion and the first interconnection,
the third pulse being supplied to the first memory portion via the first switch.

Configuration 4

The magnetic memory device according to Configuration 1 or 2, further comprising a first switch provided in a first current path including the first conductive portion, the first memory portion, and the first interconnection,
the first pulse and the second pulse being supplied to the first memory portion via the first switch.

Configuration 5

The magnetic memory device according to Configuration 4, further comprising a second interconnection electrically connected to a first gate of the first switch.

Configuration 6

The magnetic memory device according to Configuration 4 or 5, further comprising:
a second memory portion; and
a second switch,
the second memory portion including
a second magnetic portion including a third portion and a fourth portion,
a second magnetic layer, and
a second nonmagnetic layer provided between the fourth portion and the second magnetic layer,
the second switch being provided in a second current path including the second memory portion and the first interconnection,
the controller switching the first switch ON and switching the second switch OFF in the first write operation,
the controller switching the first switch ON and switching the second switch OFF in the first shift operation.

Configuration 7

The magnetic memory device according to Configuration 6, further comprising a third interconnection electrically connected to a second gate of the second switch.

Configuration 8

The magnetic memory device according to Configuration 6 or 7, wherein
the controller switches the first switch OFF and switches the second switch ON in a second write operation, and
the controller switches the first switch OFF and switches the second switch ON in a second shift operation.

Configuration 9

The magnetic memory device according to any one of Configurations 1 to 8, wherein
the first magnetic portion has a tubular configuration extending along a first direction,
the first magnetic portion has a first surface on an outer side, and a position of the first surface in a second direction changes periodically along the first direction, the second direction crossing the first direction.

Configuration 10

The magnetic memory device according to any one of Configurations 1 to 9, wherein
the first magnetic portion has a tubular configuration extending along a first direction,
the first magnetic portion has a second surface on an inner side, and
a position of the second surface in a second direction changes periodically along the first direction, the second direction crossing the first direction.

Configuration 11

The magnetic memory device according to any one of Configurations 1 to 10, wherein
the first pulse is positive when writing first information in the first write operation, and
in the first write operation, the first pulse is negative when writing second information different from the first information.

Configuration 12

The magnetic memory device according to any one of Configurations 1 to 11, wherein
the second pulse is positive when shifting information in a first orientation in the first shift operation, and
the second pulse is negative when shifting the information in a second orientation in the first shift operation, the second orientation being the reverse of the first orientation.

Configuration 13

The magnetic memory device according to any one of Configurations 1 to 12, wherein
the first magnetic portion includes a domain wall, and
a position of the domain wall is different before and after the applying of the second pulse.

Configuration 14

The magnetic memory device according to any one of Configurations 1 to 13, wherein
in the first write operation, the controller applies a first prepulse between the first conductive portion and the first interconnection before the applying of the first pulse, the first prepulse having a first prepulse height and a first prepulse length,
an absolute value of the first prepulse height is less than the absolute value of the first pulse height,
the first prepulse length is longer than the first pulse length, and
a polarity of the first prepulse is the reverse of a polarity of the first pulse.

Configuration 15

The magnetic memory device according to Configuration 14, wherein the first prepulse length is not less than 0.2 times but less than 1 times the second pulse length.

Configuration 16

The magnetic memory device according to Configuration 14 or 15, wherein the first prepulse length is 0.5 times the second pulse length or less.

Configuration 17

The magnetic memory device according to any one of Configurations 1 to 16, wherein
the absolute value of the second pulse height is ½ of the absolute value of the first pulse height or less, and
the second pulse length is 2 times the first pulse length or more.

According to the embodiments, a magnetic memory device can be provided in which the storage density can be increased.

In the specification, "perpendicular" and "parallel" include not only strictly perpendicular and strictly parallel but also, for example, the fluctuation due to manufacturing processes, etc.; and it is sufficient to be substantially perpendicular and substantially parallel.

In the specification, the state of being electrically connected includes a state in which a first conductor and a second conductor contact each other. The state of being electrically connected includes a state in which a third conductor is provided in a current path between a first conductor and a second conductor, and a current flows in the current path. The state of being electrically connected includes a state in which a control element such as a switch or the like is provided in a current path between a first conductor and a second conductor, and a state is formable in which a current flows in the current path due to an operation of the control element.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in magnetic memory devices such as magnetic portions, magnetic layers, nonmagnetic layers, conductive portions, and controllers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all magnetic memory devices practicable by an appropriate design modification by one skilled in the art based on the magnetic memory devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory device, comprising:
a first memory portion including
a first magnetic portion including a first portion and a second portion,
a first magnetic layer, and
a first nonmagnetic layer provided between the second portion and the first magnetic layer;
a first conductive portion electrically connected to the first portion;
a first interconnection electrically connected to the first magnetic layer; and a controller electrically connected to the first conductive portion and the first interconnection, the controller being configured to apply a first pulse between the first conductive portion and the first interconnection in a first write operation, the first pulse having a first pulse height and a first pulse length, the controller being configured to apply a second pulse between the first conductive portion and the first interconnection in a first shift operation, the second pulse having a second pulse height and a second pulse length, an absolute value of the second pulse height being less than an absolute value of the first pulse height, the second pulse length being longer than the first pulse length.

2. The device according to claim 1, wherein the controller applies a third pulse between the first conductive portion and the first interconnection in a first read operation, the third pulse having a third pulse height and a third pulse length, and an absolute value of the third pulse height is less than the absolute value of the second pulse height.

3. The device according to claim 2, further comprising a first switch provided in a first current path between the first conductive portion and the first interconnection, the third pulse being supplied to the first memory portion via the first switch.

4. The device according to claim 1, further comprising a first switch provided in a first current path including the first conductive portion, the first memory portion, and the first interconnection, the first pulse and the second pulse being supplied to the first memory portion via the first switch.

5. The device according to claim 4, further comprising a second interconnection electrically connected to a first gate of the first switch.

6. The device according to claim 4, further comprising:

a second memory portion; and a second switch, the second memory portion including a second magnetic portion including a third portion and a fourth portion, a second magnetic layer, and a second nonmagnetic layer provided between the fourth portion and the second magnetic layer, the second switch being provided in a second current path including the second memory portion and the first interconnection, the controller switching the first switch ON and switching the second switch OFF in the first write operation, the controller switching the first switch ON and switching the second switch OFF in the first shift operation.

7. The device according to claim 6, further comprising a third interconnection electrically connected to a second gate of the second switch.

8. The device according to claim 6, wherein the controller switches the first switch OFF and switches the second switch ON in a second write operation, and the controller switches the first switch OFF and switches the second switch ON in a second shift operation.

9. The device according to claim 1, wherein the first magnetic portion has a tubular configuration extending along a first direction, the first magnetic portion has a first surface on an outer side, and a position of the first surface in a second direction changes periodically along the first direction, the second direction crossing the first direction.

10. The device according to claim 1, wherein the first magnetic portion has a tubular configuration extending along a first direction, the first magnetic portion has a second surface on an inner side, and a position of the second surface in a second direction changes periodically along the first direction, the second direction crossing the first direction.

11. The device according to claim 1, wherein the first pulse is positive when writing first information in the first write operation, and in the first write operation, the first pulse is negative when writing second information different from the first information.

12. The device according to claim 1, wherein the second pulse is positive when shifting information in a first orientation in the first shift operation, and the second pulse is negative when shifting the information in a second orientation in the first shift operation, the second orientation being the reverse of the first orientation.

13. The device according to claim 1, wherein the first magnetic portion includes a domain wall, and a position of the domain wall is different before and after the applying of the second pulse.

14. The device according to claim 1, wherein in the first write operation, the controller applies a first prepulse between the first conductive portion and the first interconnection before the applying of the first pulse, the first prepulse having a first prepulse height and a first prepulse length, an absolute value of the first prepulse height is less than the absolute value of the first pulse height, the first prepulse length is longer than the first pulse length, and a polarity of the first prepulse is the reverse of a polarity of the first pulse.

15. The device according to claim 14, wherein the first prepulse length is not less than 0.2 times but less than 1 times the second pulse length.

16. The device according to claim 14, wherein the first prepulse length is 0.5 times the second pulse length or less.

17. The device according to claim 1, wherein the absolute value of the second pulse height is ½ of the absolute value of the first pulse height or less, and the second pulse length is 2 times the first pulse length or more.

* * * * *